United States Patent
Bershteyn et al.

(10) Patent No.: US 8,027,828 B2
(45) Date of Patent: Sep. 27, 2011

(54) METHOD AND APPARATUS FOR SYNCHRONIZING PROCESSORS IN A HARDWARE EMULATION SYSTEM

(75) Inventors: Mikhail Bershteyn, Cupertino, CA (US); Charles Berghorn, Pleasant Valley, NY (US); Mitchell G. Poplack, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 834 days.

(21) Appl. No.: 11/444,032

(22) Filed: May 31, 2006

(65) Prior Publication Data
US 2007/0282589 A1 Dec. 6, 2007

(51) Int. Cl.
G06F 9/455 (2006.01)

(52) U.S. Cl. .......................................... 703/23

(58) Field of Classification Search ............... 703/23, 703/26, 28; 716/3, 4, 5; 717/124, 134, 138, 717/140
See application file for complete search history.

(56) References Cited

U.S. PATENT DOCUMENTS

| | | | |
|---|---|---|---|
| 6,051,030 A | | 4/2000 | Beausoleil et al. |
| 6,094,715 A * | | 7/2000 | Wilkinson et al. ............. 712/20 |
| 6,832,185 B1 * | | 12/2004 | Musselman et al. ............ 703/23 |
| 6,901,359 B1 | | 5/2005 | Beausoleil et al. |
| 7,389,317 B2 * | | 6/2008 | Guttag et al. ................. 708/620 |
| 2003/0105620 A1 * | | 6/2003 | Bowen ............................. 703/22 |
| 2004/0019827 A1 | | 1/2004 | Rohfleisch et al. |
| 2005/0267730 A1 | | 12/2005 | Kfir et al. |
| 2008/0077771 A1 * | | 3/2008 | Guttag et al. ................. 712/204 |

OTHER PUBLICATIONS

International Search Report mailed Nov. 1, 2007 for PCT Application No. PCT/US2007/012846.
Written Opinion of the International Searching Authority, mailed Nov. 1, 2007 for PCT Application No. PCT/US2007/012846.

* cited by examiner

Primary Examiner — Paul Rodriguez
Assistant Examiner — Andre Pierre Louis
(74) Attorney, Agent, or Firm — Holland & Knight LLP; Brian J Colandreo, Esq.; Mark H Whittenberger, Esq.

(57) ABSTRACT

A method, apparatus and method for compiling a hardware design for performing hardware emulation using synchronized processors is described. The apparatus comprises a plurality of processors defining a processor group for evaluating data regarding a hardware design and a synchronizer for synchronizing the operation of the processor group while emulating at least a portion of the hardware design. The method comprises providing a synchronization signal to a plurality of processors defining a processor group for evaluating data regarding a hardware design, receiving a ready signal from the processor group, and providing an execution signal to the processor group, where the execution signal causes the processor group to evaluate a submodel. The method for compiling the hardware design comprises converting at least one high-level construct into a sequence of operations and identifying a sequence of operations that comprise at least one conditional submodel.

15 Claims, 8 Drawing Sheets

METHOD AND APPARATUS FOR SYNCHRONIZING PROCESSORS IN A HARDWARE EMULATION SYSTEM

BACKGROUND OF THE INVENTION

1. Field of the Invention

Embodiments of the present invention generally relate to a processor based hardware emulation engine and, more specifically, to a method and apparatus for synchronizing processors within the emulation engine.

2. Description of the Related Art

Hardware emulators are programmable devices used in the verification of hardware designs. A common method of hardware design verification is to use processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Hardware emulators need to improve in efficiency to keep pace with the increased complexity of integrated circuits. The speed with which a hardware emulator can emulate an integrated circuit is one of the most important benchmarks of the emulator's efficiency, and also one of the emulator's most important selling factors in the emulator market.

A hardware emulator is comprised of multiple processors. During each process cycle, each processor is capable of emulating a logic gate, mimicking the function of a logic gate in an integrated circuit. The processors are arranged to compute results in parallel, in the same way logic gates present in an integrated circuit compute many results in parallel. This creates a chain of logic similar to what occurs in an integrated circuit. In the chain of logic, efficient communication between processors is crucial.

The programs executed by the processors in a hardware emulator consist of instructions containing a sequence of operations. The entire sequence of operations is known as a model. The model is further comprised of an unconditional model, i.e., a sequence of operations that are not dependent upon the outcome of any other sequence of operations, and one or more conditional models, i.e., a sequence of operations whose execution is dependent upon the outcome of another sequence of operations. The conditional and unconditional models are referred to herein as "submodels" with respect to the overall "model" of the hardware.

Certain operations act directly upon data, while other operations describe the conditions necessary for the data to be acted upon. For example, consider the conditional submodel described by the sequence of operations described by equation 1:

$$if(a!=0)\ b=c+d \qquad (1)$$

The operation "b=c+d" (b equals c plus d) acts upon the data element "b" using "c" and "d" as operands. The operation "a !=0" (a does not equal zero) describes the condition necessary for data element "b" to be acted upon.

Conditional submodels were previously not evaluated using an emulator because evaluating the conditional submodel would decrease the efficiency of inter-processor communication, i.e., additional emulation steps are needed to evaluate a conditional submodel versus evaluating non-conditional submodels. The conditional submodel such as the one described has two possible results. The efficiency of inter-processor communication is decreased because calculation of the correct result requires extra emulation steps; further, the processors cannot calculate the result in parallel because the output of the first part of the equation, i.e., if (a!=0), is uncertain. Therefore, a compiler must convert the conditional submodel into a logically equivalent, but lengthier, non-conditional submodel. For example, if a, b, c and d are Boolean operands, the above sequence of operations may be rewritten as equation 2:

$$b=a\ \&(c+d)|!a\ \&b \qquad (2)$$

The above equation is a lengthier, logical non-conditional equivalent of the above conditional equation. The hardware emulator must evaluate the lengthier non-conditional equation even if the first part of the conditional statement it is based upon is likely to be false, i.e., the first part of the equation is not true and the remainder of the equation does not need to be evaluated.

Thus, there is a need in the art for a processor-based hardware emulation system capable of efficiently evaluating conditional submodels. The hardware emulation system should avoid evaluating submodels for which the conditions of execution are not satisfied.

SUMMARY OF THE INVENTION

The present invention generally relates to a processor-based hardware emulation system comprising a group of synchronized processors. The apparatus comprises a plurality of processors defining a processor group for evaluating data regarding a hardware design and a synchronizer for synchronizing the operation of the processor group while emulating at least a portion of the hardware design. The method comprises providing a synchronization signal to a plurality of processors defining a processor group for evaluating data regarding a hardware design, receiving a ready signal from the processor group, and providing an execution signal to the processor group, where the execution signal causes the processor group to evaluate a submodel. The method for compiling the hardware design comprises converting at least one high-level construct into a sequence of operations and identifying a sequence of operations that comprise at least one conditional submodel. By identifying the conditional submodels, the system can assign the conditional submodels to a specific processor group or groups for evaluation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is a processor-based hardware emulation system comprising at least one synchronized group of processors as well as a compiler for identifying conditional submodels for evaluation by such synchronized processor groups.

Figure 1:
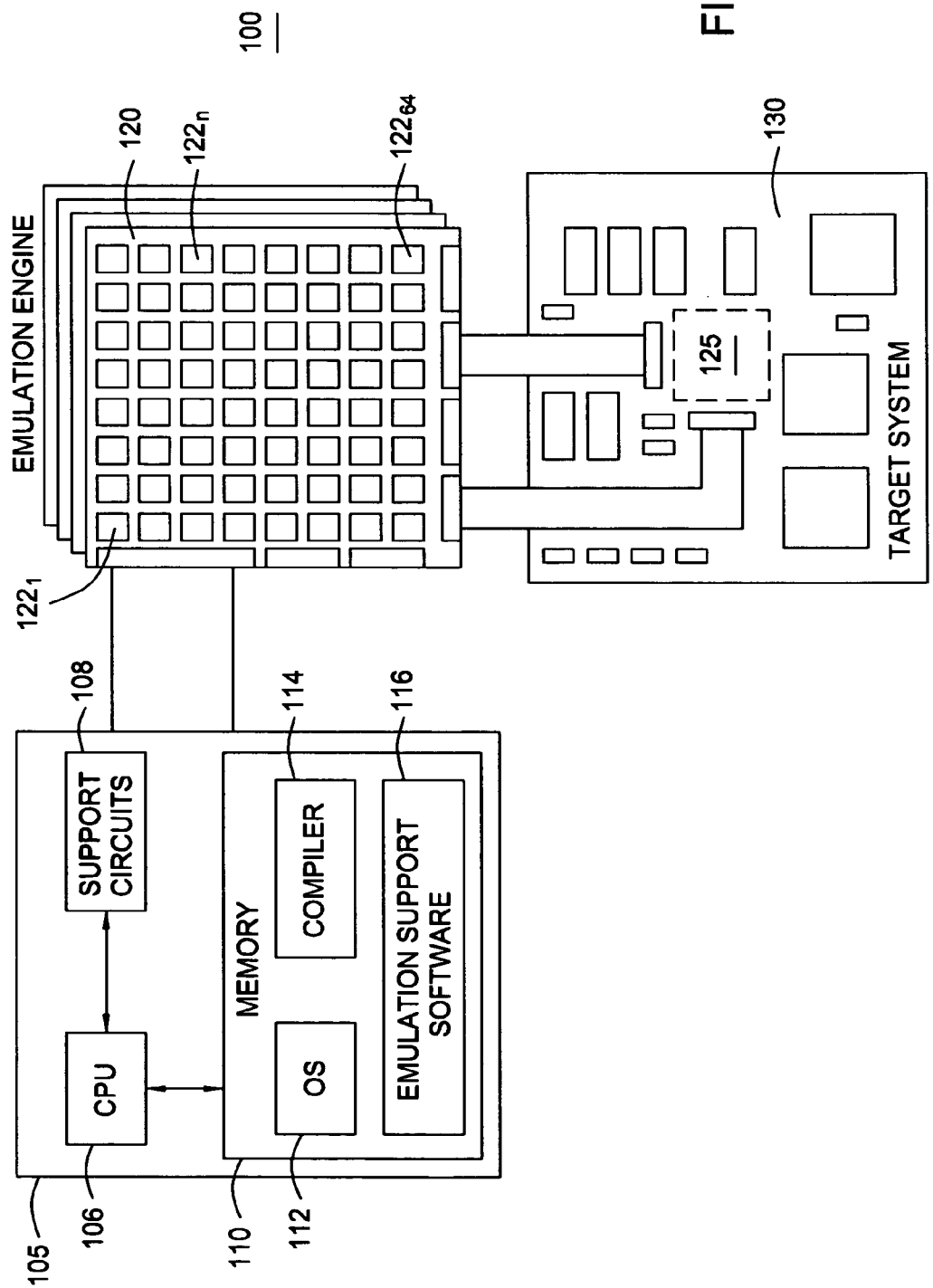
FIG. 1 is an overview of an emulation system.

FIG. 1 depicts an overview of an emulation system 100. The system comprises a computer workstation 105, an emulation board 120 and a target system 130. The computer workstation 105 provides emulation support facilities to the emulation board 120.

The computer workstation 105 comprises at least one central processing unit (CPU) 106, support circuits 108 and a memory 110. The CPU 106 may comprise one or more conventionally available microprocessors and/or microcontrollers. The support circuits 108 are well known circuits that are used to support the operation of the CPU 106. These circuits comprise power supplies, docks, input/output interface circuitry, cache and the like.

Memory 110 may comprise random access memory, read only memory, removable disk memory, flash memory, optical storage and various combinations of these types of memory. The memory 110 is sometimes referred to as main memory and may in part be used as cache memory or buffer memory. The memory 110 stores various forms of software and files, such as an operating system (OS) 112 and a compiler 114.

The compiler 114 converts a hardware design, e.g., hardware described in VHDL or Verilog, to a sequence of instructions that can be evaluated by the emulation board 120.

The computer workstation 105 allows a user to interface with the emulation board 120, control the emulation process and collect emulation results for analysis. The emulation board 120 is composed of individual emulation circuits $122_1$ to $122_{64}$ (collectively 122). Typically, the emulation circuits 122 are integrated circuits (also referred to herein as emulation chips). Under control of the computer workstation 105, programming information and data is loaded to the emulation board 120.

In response to the programming received from the emulation support facilities 110, the emulation board 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
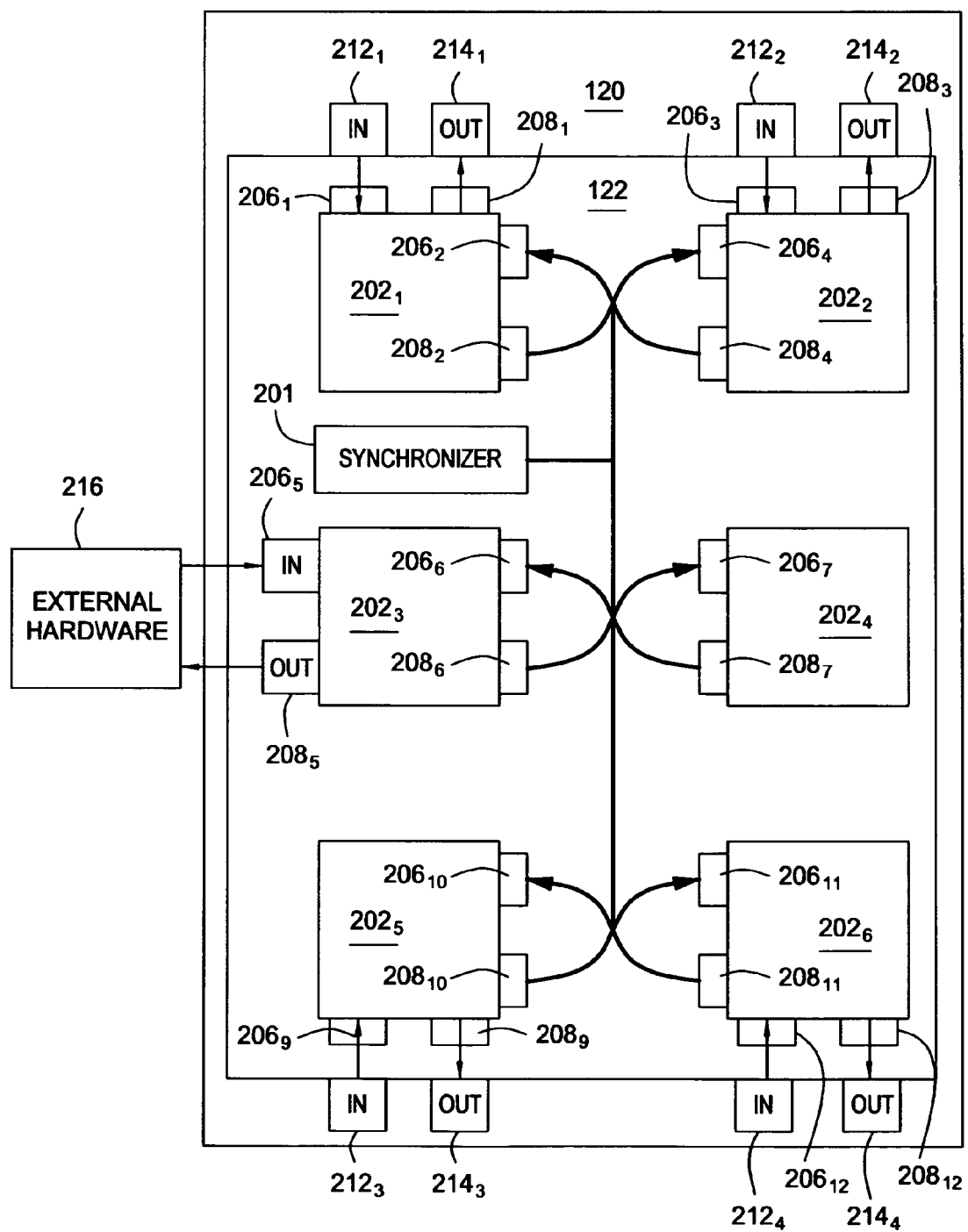
FIG. 2 is a block diagram of an emulation engine that is part of the emulation system.

FIG. 2 depicts an expanded view of an emulation chip 122 that is utilized by the emulation board 120. The emulation chip 122 comprises synchronized groups of processors $202_1$ to $202_6$ (collectively 202) capable of communicating with each other and a synchronizer 201. Each synchronized group of processors 202 has at least one input 206 and at least one output 208. The input 206 and output 208 allows each synchronized group of processors 202 to communicate with other synchronized groups of processors 202, other emulation chips via input connectors 212 and output connectors 214, external hardware 216 and the synchronizer 201. The external hardware 216 may be a VLSI circuit, a debugger, a memory, or any combination of hardware and software from which the emulation chip 122 can benefit. The emulation chip 122 has input connectors $212_1$ to $212_4$ (collectively 212) for receiving data from other emulation chips and output connectors $214_1$ to $214_4$ (collectively 214), known as chip pads, for supplying data to other emulation chips.

Figure 3:
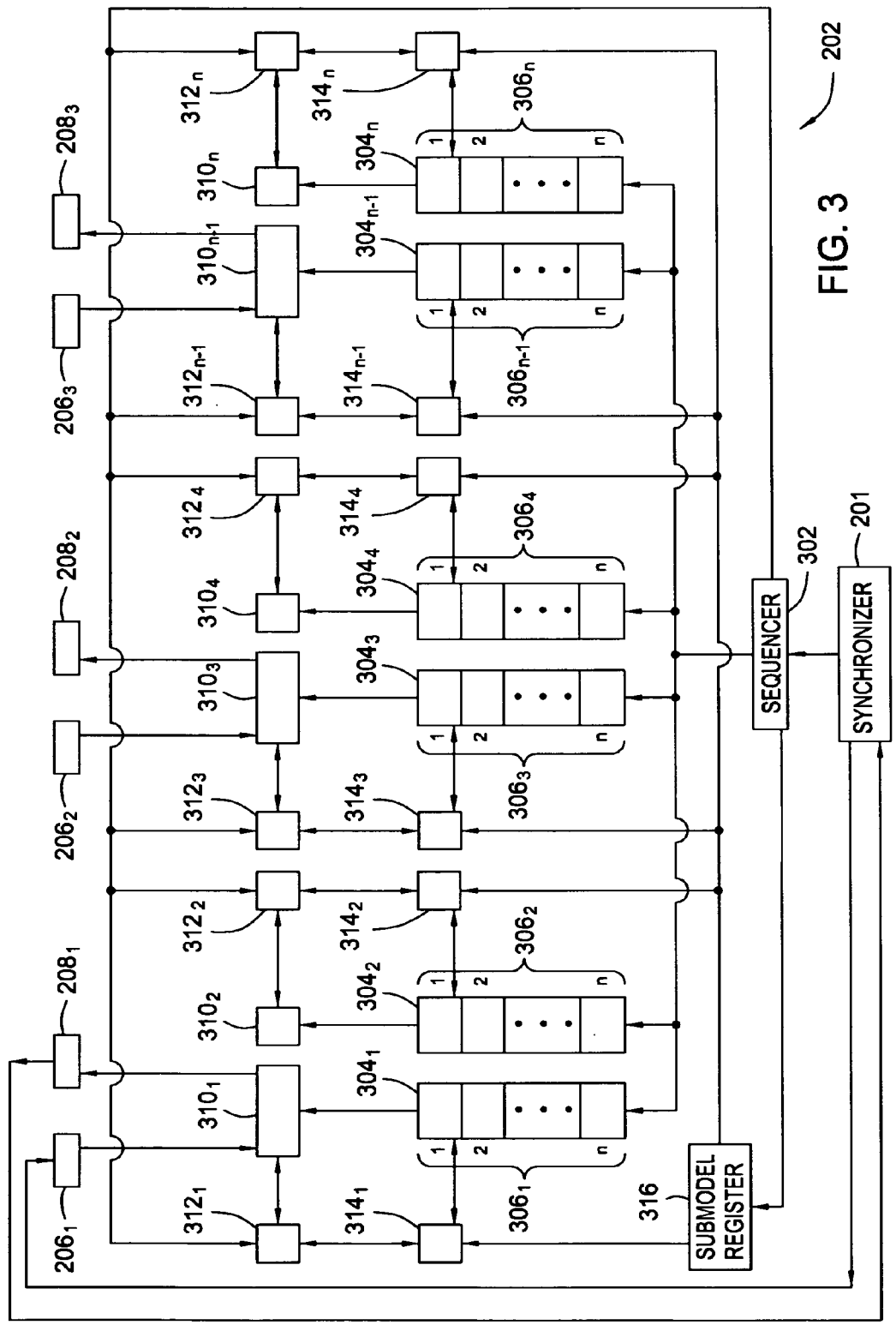
FIG. 3 is a block diagram of a synchronized processor group in accordance with one embodiment of the present invention.

FIG. 3 depicts an expanded view of a synchronized group of processors (SPG) 202. The SPG 202 comprises instruction memories $304_1$ to $304_n$ (collectively 304), processors $310_1$ to $310_n$ (collectively 310), data memories $312_1$ to $312_n$ (collectively 312), and submodel matching blocks $314_1$ to $314_n$ (collectively 314). Each SPG 202 has at least one input 206 and at least one output 208. For simplicity, SPG 202 is shown as having inputs $206_1$ to $206_3$ and outputs $208_1$ to $208_3$. A common sequencer 302 and common submodel register 316 are shared by the synchronized group of processors 202. The synchronized groups of processors 202 are synchronized by the synchronizer 201 (shown in FIG. 2).

The SPG 202 evaluates an unconditional submodel, i.e., an unconditional sequence of operations not dependent upon the outcome of any other sequence of operations, and at least one conditional submodel, i.e., a sequence of operations where execution of the sequence is dependent upon the outcome of another sequence of operations. The unconditional and conditional submodels are each identified by a submodel identifier.

Each processor 310 is coupled to its associated instruction memory 304. The sequencer 302 is connected to each of the instruction memories 304. Each processor 310 is also coupled to its associated data memory 312. Some of the processor 310 are coupled to input 206 and to output 208. More specifically, processor $310_1$ is coupled to input $206_1$ and output $208_1$, processor $310_3$ is coupled to input $206_2$ and output $208_2$, and processor $310_{n-1}$ is coupled to input $206_3$ and output $208_3$. Each data memory 312 is coupled to its associated submodel matching block 314. Each submodel matching block 314 is coupled to its associated instruction memory 304. Each submodel matching block 314 is coupled to the common submodel register 316.

The processors 310 are a fundamental component of the emulation engine 120. The processors primary function is to execute an N-input logical function (where N is an integer) and produce a single bit result known as a function bit out. The inputs for each logic function can be selected from a variety of sources, including bits stored from a previous operation, or from another one or more processors. The resulting function bit out may correspond to any one of: a logic gate output of the emulated design, a register output of the emulated design, a synthesized intermediate logic state, or a control bit generated for the emulation process. In one embodiment of the invention, one of the processors (shown in FIG. 3 as processor $310_1$) functions as a synchronization processor. The synchronization processor $310_1$ is coupled to the synchronizer 201 via input $206_1$ and output $208_1$ to synchronize the synchronized group of processors 202.

The instruction memories 304 are comprised of individual instruction slots 306, selectable by the read addresses for an instruction word. Each instruction slot 306 is consecutively numbered from 0 to a maximal number that reflects the capacity of the instruction memory 304. Each instruction slot 306 contains an instruction word that is evaluated by the processor 310.

The instruction word comprises a field that contains the submodel identifier of the submodel (conditional or unconditional) that is to be evaluated. The field is matched by the submodel matching block 314 to another submodel identifier within the submodel register 316. If the two submodel identifiers match, then the output of the evaluated instruction word will be stored to the memory 312. If the submodel identifiers do not match, then the output of the evaluated instruction word is not stored to the memory 312.

The sequencer 302 functions as an instruction point register and controls which instruction slots 306, are accessed by the processors 310 by supplying read addresses to instruction memories 304. When an instruction other than a conditional branch is executed by the processor 310, the instruction point register 302 assumes a value equal to its previous value plus one. When a conditional branch is the executed by the processor 310, the sequencer 302 assumes a new value, i.e., the sequencer 302 points to an instruction slot 306 that is not necessarily the next instruction slot 306 in sequential order to begin evaluation of the conditional branch. The sequencer 302 is also coupled to each data memory 312 and to the submodel register 316. The sequencer 302 provides write addresses for each data memory 312 and read addresses for the submodel register 316.

The data memories 312 generally store the output produced by their respective processors 310. The data memories 312 are selectable-write memories, i.e., the ability to write to the memory 312 from the processor 310 may be enabled or disabled.

The submodel matching blocks 314 control the selectable-write capability of their associated memories 312. The submodel matching blocks 314 are coupled to their associated memories 312, coupled to their associated instruction memories 304 and also coupled to the common submodel register 316. Submodel matching blocks 314 match a submodel described in an instruction word to a submodel described in the submodel register 316. Based upon the comparison of the two submodels, the submodel matching block 314 can control the selectable write ability of the memory 312. If the submodels match, then the submodel matching block 314 allows the processor 310 to write the output of the evaluated submodel to the memory 312. If the submodels do not match, then the submodel identifier 314 does not allow the processor 310 to write the output of the evaluated submodel to the memory 312.

The submodel register 316 stores submodel identifiers. The submodel register 316 provides the submodel identifiers to the submodel matching blocks 314 under control of the sequencer 302. The submodel identifiers are used by the submodel matching block 314 to identify submodels present in the instruction word(s) 308.

The synchronizer 201 (shown in FIG. 2) synchronizes each synchronized group of processors (SPG) 202. One of the processors 310 provides a special synchronization signal to its SPG 202 placing the SPG 202 into a "wait" state. The SPG 202 then sends a "ready" signal to the synchronization block 201. Once the synchronizer 201 has received the ready signal from all of the synchronized processor groups 202, the synchronizer 201 commands the SPG's 202 to evaluate data in unison. The method by which synchronization is performed is described in detail below in FIG. 4.

Figure 4:
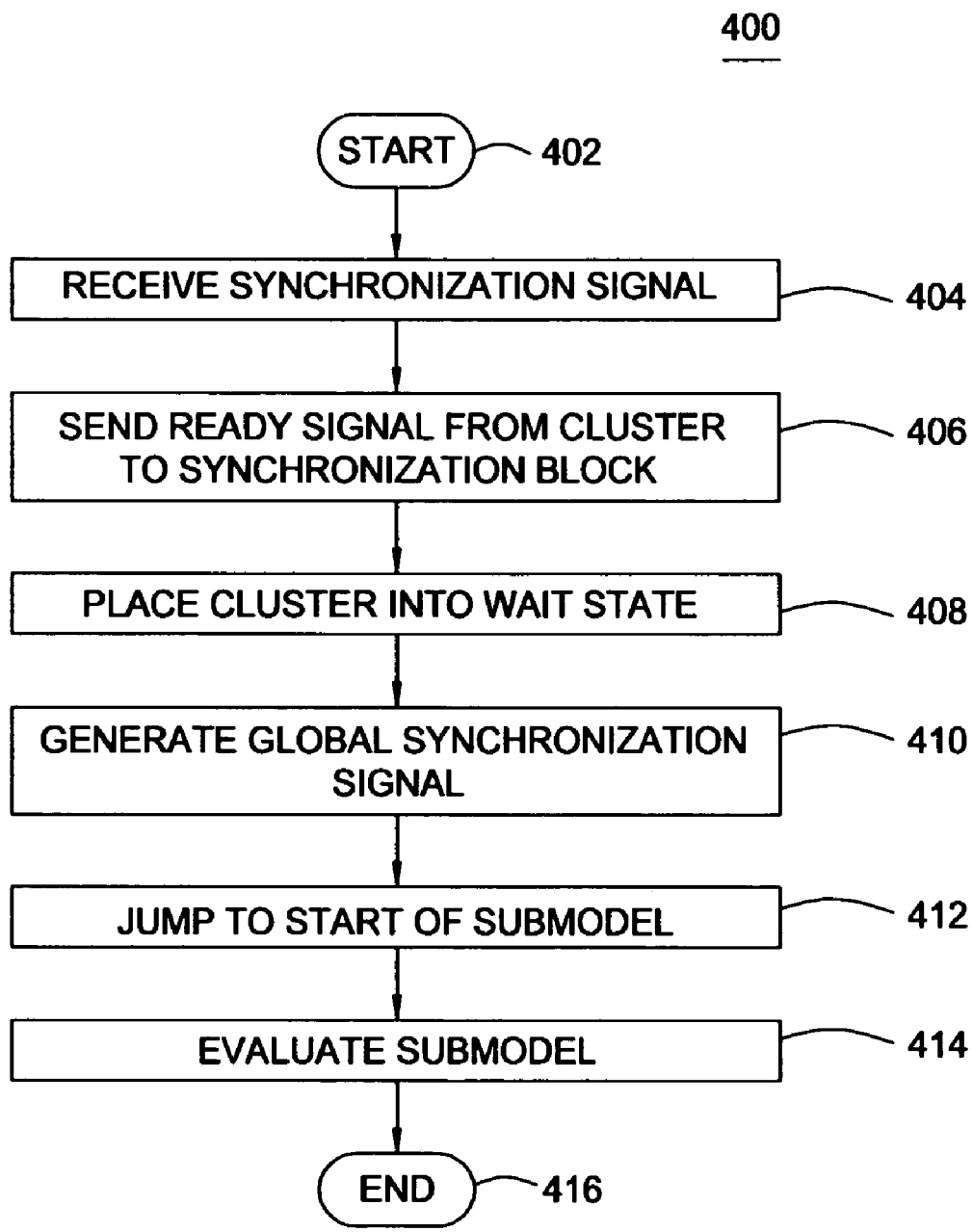
FIG. 4 is a flow diagram of a method for synchronizing a group of processors in accordance with one embodiment of the present invention.

FIG. 4 is a flow diagram of a method 400 that may be utilized by the synchronizer 201 to synchronize groups of processors 202. The method 400 may be used to synchronize groups of processors 202 during the evaluation of a specific model, i.e., an unconditional or conditional submodel. While the synchronized groups of processors 202 evaluate a specific submodel, the non-synchronized processors 310, i.e., the groups of processors that were not assigned to evaluate the submodel; are placed into a wait state. These groups are essentially placed into the same condition as a synchronized group of processors 202 that has finished evaluating its submodel. The non-synchronized processors wait for a signal from the synchronizer 201 indicating the synchronized groups of processors 202 have completed evaluation of their submodel before allowing their sequencer 302 to advance to the next instruction.

The method 400 begins at block 402 and proceeds to block 404. At block 404, a synchronization instruction is received by each of the groups of processors 202. One of the processors 310 in each group 202 is a special processor used to control the synchronization process. These special processors 310 receive the synchronization instruction from their associated instruction memories 304. Although physically identical to all the other processors 310, for this synchronization function, one processor 310 (shown as processor $310_1$ in FIG. 3) in each group 202 is selected to control the synchronization of the group 202.

At block 406, the synchronization processors 310 place their associated groups 202 into a wait state. During the wait state, the processors 310 are incapable of executing any further instructions, and the value of the sequencer 302 remains unchanged. At block 408, the synchronization processors 310 within each group 202 send a "ready" signal to the synchronizer 201 indicating the group 202 is ready to execute a synchronized submodel.

The synchronizer 201 is addressed by the special processor 310 in the SPG 202. As part of the model download, workstation 105 makes synchronizer 201 aware of the number of synchronized groups 202 required for proper execution of the particular model. The synchronizer 201 waits until each required group 202 transmits a "ready" signal. The method 400 does not proceed to the next step until all "ready" signals have been received by the synchronizer 201. At block 410, the synchronizer 201 generates a global synchronization signal after receiving all of the "ready" signals from each of the groups 202. The synchronization signal is provided from the synchronizer 201 to the sequencer 302. At block 412, the synchronization signal supplied from the synchronizer 201 to the instruction point register 302 causes the instruction memories 304 to jump to the instruction slot 306 that is the start of the submodel evaluated by the synchronized group of processors 202.

At block 414, the synchronized group of processors 202 evaluate the unconditional submodel in unison. The synchronized group of processors 202 continue to evaluate the unconditional submodel in unison until one of the groups 202 encounters a conditional submodel instruction. The method 400 ends at block 416.

Figure 5:
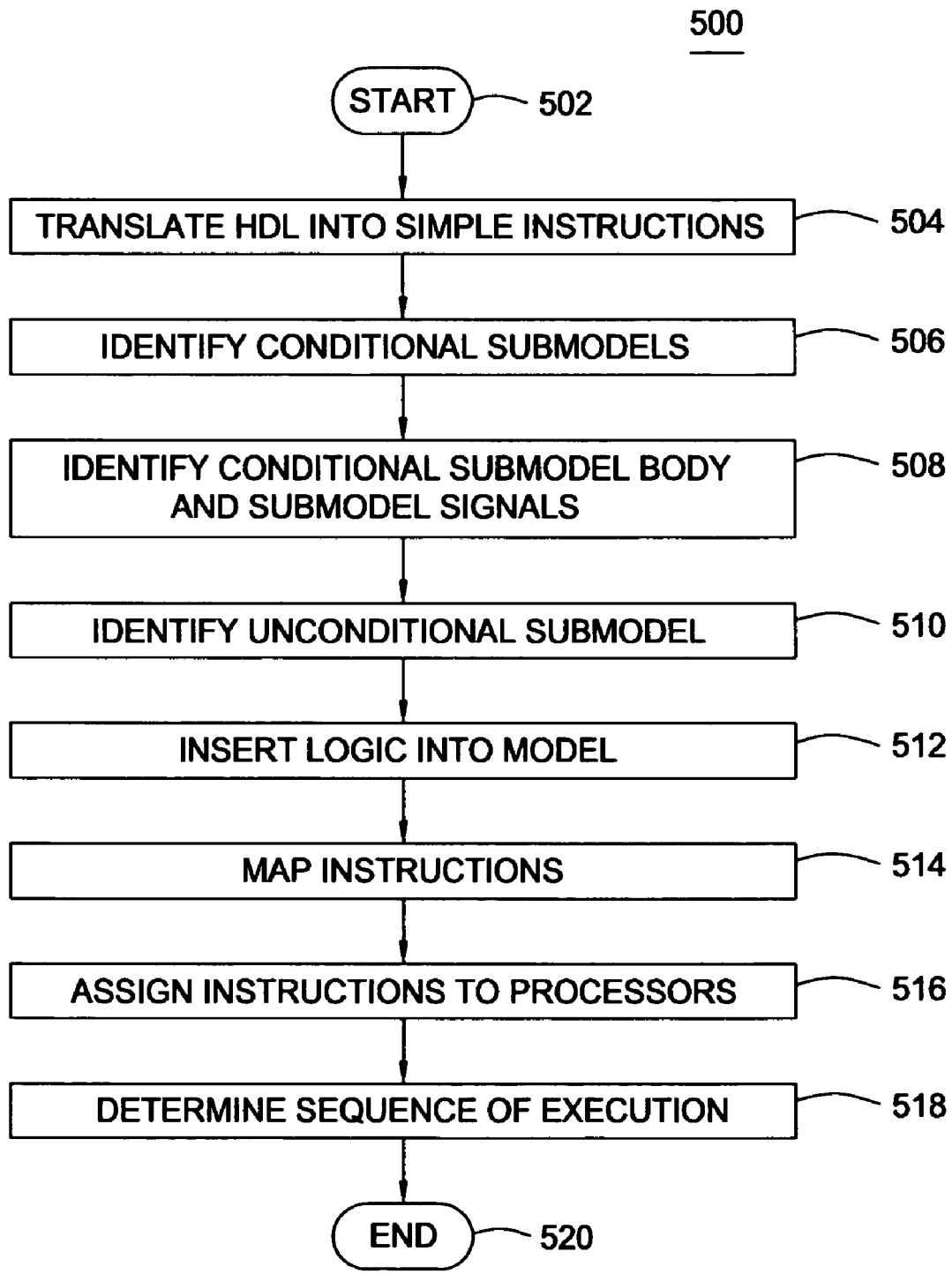
FIG. 5 is a flow diagram of a method utilized by a compiler in accordance with one embodiment of the present invention.
Figure 6:
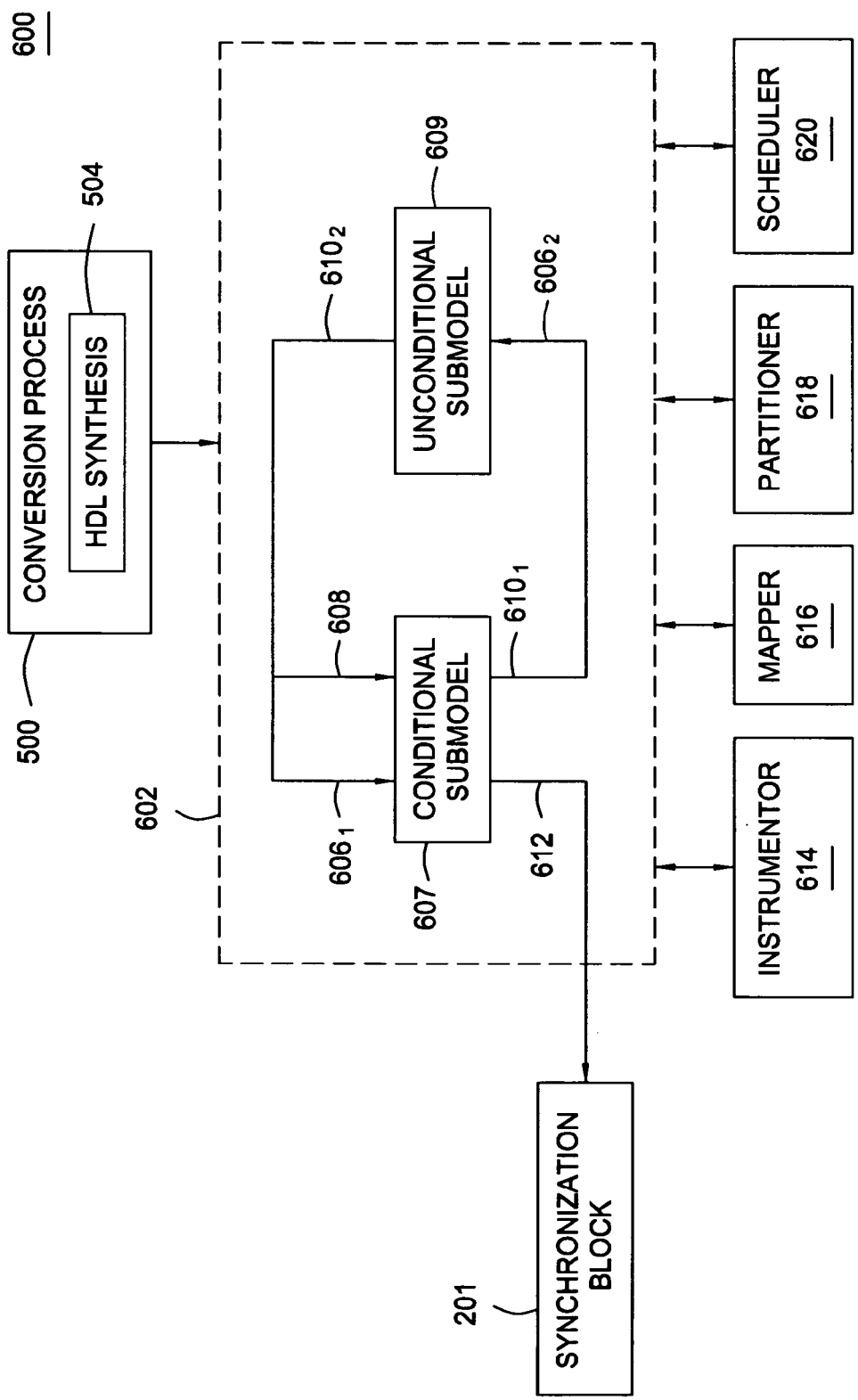
FIG. 6 is a block diagram of the compiler.

FIGS. 5 and 6 together depict the operation and function of the compiler 114 that is used to generate instructions for performing submodel evaluation using the synchronized processor groups. The compiler 114 utilizes a process 500 to convert hardware description written in a programming language such as VERILOG or VHDL into a sequence of instructions that can be evaluated by the emulation system 100.

FIG. 6 is a functional block diagram of the compiler 114. The compiler 114 comprises a Hardware Description Language (HDL) synthesis block 504, an instrumentor 614, a mapper 616, a partitioner 618, and a scheduler 620. The HDL synthesis block 504 converts HDL instructions into conditional submodel(s) 607, conditional submodel signals $606_1$/$608$/$610_1$/$612$, unconditional submodel 609 and unconditional submodel signals $606_2$ and $610_2$ to form a design database 602. The instrumentor 614, mapper 616, partitioner 618, and scheduler 620 further process the design database 602 as described below.

The conditional submodel 607 receives input signal $606_1$ and activation signal 608. The conditional submodel produces output signal $610_1$ and completion signal 612. The activation signal 608 signals a processor 310 to begin evaluation of the conditional submodel 607. The processor 310 evaluates the input signal $606_1$ and produces output signal $610_1$ in response. The input signal $606_1$ may be selected as an operand by one or more instruction words provided by the instruction memories 304, i.e., the input signal $606_1$ may be one or several signals. The output signal $610_1$ may also be one or more signals. The completion signal 612 indicates that the conditional submodel 607 has been fully evaluated. Upon receipt of the completion signal 612, the synchronized group of processors 202 resumes evaluation of the unconditional submodel 609.

The unconditional submodel 609 executes continuously until interrupted by a conditional submodel 607. The unconditional submodel 609 does not require an activation signal or a completion signal because it is continuously executed. The unconditional submodel 609 receives input signal $606_1$ and produces output signal $610_2$. The input signal $606_2$ may be selected as an operand by one or more instruction words provided by the instruction memories 304, i.e., the input signal $606_2$ may be one or several signals. The output signal $610_2$ may also be one or more signals.

FIG. 5 depicts a flow diagram of a process 500 utilized by a compiler (shown in FIG. 1 as 114) in accordance with one embodiment of the present invention. FIG. 6 is a block diagram of the compiler 114. The compiler 114 translates the design under verification into instructions that can be stored in the instruction memories 304 and evaluated by the processors 310.

The process 500 starts at block 502 and proceeds to block 504. At block 504, the compiler 114 translates a hardware design written in a high definition language (HDL), i.e., VERILOG or VHDL, into a set of simple instructions that can be evaluated by the processors 310. At block 506, the compiler 114 identifies conditional submodels present in the instructions that can benefit from being evaluated synchronously.

The compiler 114 inspects the set of instructions to identify conditional submodels 607 that can benefit from being evaluated by a synchronized group of processors 202. The compiler 114 may convert most conditional submodel(s) 607 to an unconditional submodel 609. However, potentially long conditional submodel(s) 607, e.g., conditional submodel(s) that include commands such as:

```
       if (...)
          while (...)
    or
       if (...)
          for(...)
``` are better evaluated by the synchronized group of processors 202.

The compiler 114 is also aware that certain conditional submodel(s) 607 are inherently long and can benefit from being evaluated by the synchronized group of processors 202 without performing HDL analysis. For example, some memory models, such as content addressable memory (CAM) or multi-ported random access memory (RAM), require many accesses performed momentarily, without clock advancement. Some complex verification assertions require long series of computations which the compiler 114 must generate based on the descriptions of an even higher level than HDL synthesis. A cached memory can also benefit from the present invention. If the cache is missed, a long operation of cache line updates must follow. The duration of operations to update the cache is long, but the probability of actually having to update cache is quite low. Any conditional operation which takes a long time to complete, but has a low probability of the condition which triggers the long operation to occur can benefit from the present invention.

For simplicity, only one conditional submodel 607 is shown in FIG. 6. The conditional submodels are sets of instructions that are only executed conditionally, i.e., the submodels are executed only if a certain condition occurs. At block 508, the compiler 114 identifies a submodel body (shown in FIG. 6 as 607) for each identified conditional submodel and submodel signals (shown in FIG. 6). The submodels may be represented by finite state machines (FSM) with their states encoded as combinations of binary state elements, i.e., latches or flip-flops. The submodels may also be represented by gate-level netlists or state transition tables. The submodel signals include submodel input signals, output signals, activation signals and completion signals (shown in FIG. 6. as $606_1$/$610_1$/$608$/$612$ respectively). The expressions that produce these signals are embedded into the submodel body.

At block 510, the compiler 114 identifies an unconditional submodel (shown in FIG. 6 as 609). The unconditional submodel 609, also known as the main model, is identified by exclusion after all of the conditional submodels have been identified. The unconditional submodel 609 does not require an activation signal or a completion signal. The unconditional submodel 609 is executed continuously by the SPG 202 until it is interrupted by the conditional submodel 607 or the evaluation of the unconditional submodel 609 is complete.

The output signal $610_2$ of the unconditional submodel 609 provides the input signal $606_1$ and the activation signal 608 for the conditional submodel 607. The output signal $610_1$ of the conditional submodel 607 provides the input signal $606_2$ for the unconditional submodel 609. Completion signal 612 is provided by the conditional submodel 607 to the synchronizer 201 (shown in FIG. 2).

The design database 602 is processed in sequence by an instrumentor 614, a mapper 616, a partitioner 618, and a scheduler 620. At block 512, the instrumentor 614 inserts logic into the conditional submodel 607 and the unconditional submodel 609. The logic includes circuits that provide visibility into the state of the signals (probe circuits) and circuits that stop model operation upon reaching certain conditions (breakpoint circuits).

At block 514, the mapper 616 implements the expressions and storage elements used by the conditional submodel 607 and unconditional submodel 609. The expressions and storage elements must be of a type that can be evaluated by the processors 310. For example, if the processors 310 can only evaluate four input values at a time, any expression that uses more than four input values must be decomposed by the mapper 616 into a sequence of several instructions, i.e., several sequences of four input values or less.

At block 516, the partitioner 618 considers each conditional submodel 607 identified by HDL synthesis block 504 and assigns each submodel 607 to one or more groups of synchronized processors 202. The partitioner 618 determines a minimal number of synchronized processor groups 202 that are required to process each conditional submodel 607. In one embodiment of the invention, at most one conditional submodel 607 is assigned to each synchronized processor group 202. In another embodiment of the invention, multiple conditional submodels 607 may be assigned to each synchronized processor group 202.

The partitioner 618 also assigns the unconditional submodel 609 to one or more synchronized processor groups 202. The partitioner 618 may assign the unconditional submodel 609 to a synchronized processor groups 202 that has not been assigned to evaluate a conditional submodel 607, or it may assign the unconditional submodel 609 to unused emulation resources within a synchronized processor groups 202 that has been assigned to also evaluate a conditional submodel 607.

At block 518, the scheduler 620 determines the sequence of operations performed by each processor 310 based upon the availability of the operands and the resources to perform the operation. The scheduler 620 accounts for the fact that a signal value may only be communicated between two groups of synchronized processors 202 when both groups execute the same conditional submodel 608 or the unconditional submodel 609. In one embodiment of the present invention, the scheduler 620 also enables signals to be transmitted between a conditional submodel 607 and an unconditional submodel 609. The scheduler 620 also facilitates transmission of signals between two different conditional submodels 607. The scheduler 620 facilitates transmission by providing the signal from the first conditional submodel 607 to an unconditional submodel 609 which then provides the signal to the second conditional submodel 607.

The mechanism by which the scheduler 620 facilitates transmission of a signal from a conditional submodel 607 to an unconditional submodel 609 is described as follows. The scheduler 620 creates a copy of the signal in one of the synchronized processor groups 202 assigned to evaluate the conditional submodel 607. The signal is then copied from its original location to a location within the targeted synchronized processor group 202 during the execution of the unconditional submodel 609. Similarly, the output of the conditional submodel 607 is transmitted to its place of destination only during execution of the unconditional submodel 609.

The scheduler 620 also assigns a distinct submodel identification to each conditional submodel 607 and the unconditional submodel 609, such that only one submodel (conditional or unconditional) may be executed by a synchronized processor group 202 at any one time.

The scheduler 620 is also responsible for coordinating the execution of a conditional submodel 607 that is assigned to more than one synchronized processor group 202. The scheduler 620 must make sure that any branch instructions, i.e., jump instructions that cause the conditional submodel to read from a particular memory location, of conditional submodel 607 are placed in the same instruction memory positions, i.e., arranged in the instruction slots 306, of each synchronized processor group 202 in the same way so that complete synchronism within conditional submodel 607 is maintained.

The scheduler 620 places synchronized jump instructions into each synchronized processor group 202 that are executed under the logical condition equivalent to that of a completion signal 602 being true. Such synchronized jump instructions indicate to the synchronizer 201 that the conditional submodel 607 has been evaluated, and they simultaneously place synchronized processor group 202 into a wait state. Upon receipt of the global synchronization signal from the synchronization block 201, these instructions place a new value in the sequencer 302 that corresponds to a starting address of the unconditional submodel 609. The unconditional submodel 609 is then executed in unison by the synchronized processor groups 202. The method ends at block 520.

Figure 7A:
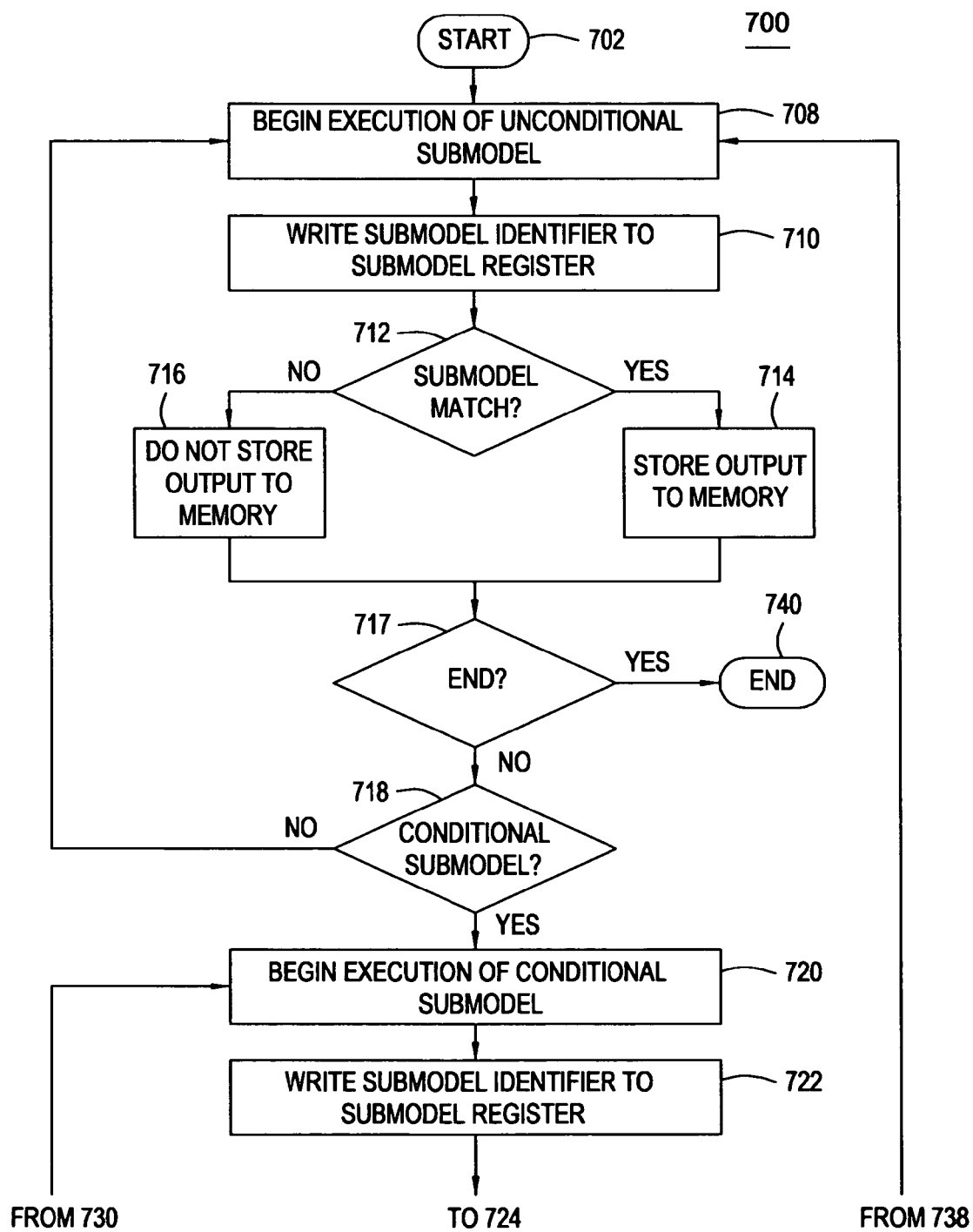
FIGS. 7A and 7B together depict a flow diagram of a method for evaluating an unconditional submodel and conditional submodel in accordance with one embodiment of the present invention.
Figure 7B:
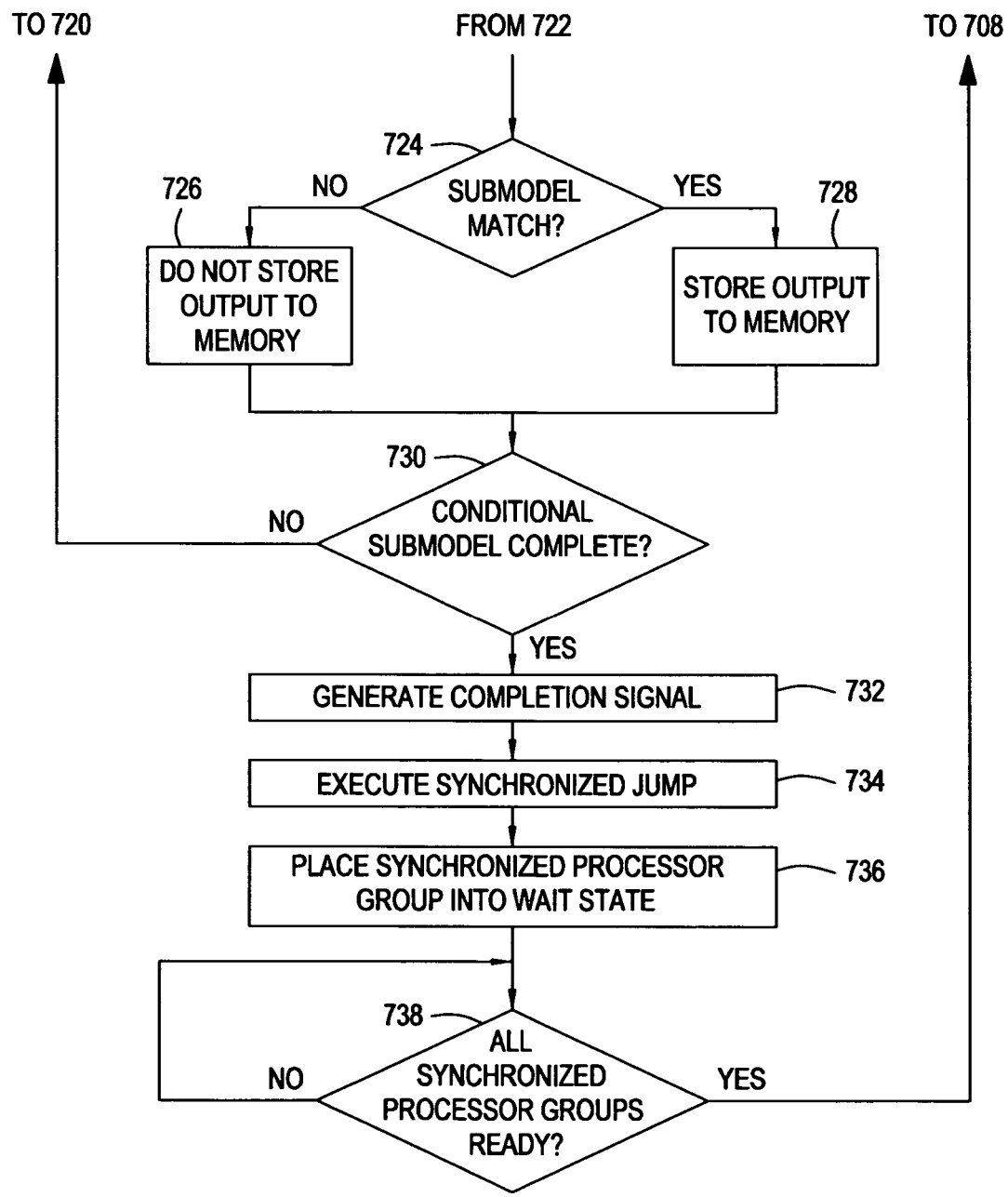

FIG. 7 is a flow diagram of a method 700 that describes execution of the conditional submodel 607 and the unconditional submodel 609 in accordance with one embodiment of the present invention. Several different conditional submodels 607 may be evaluated in parallel using the method 700 at the same time.

The method 700 starts at block 702 and proceeds to block 708. The method 700 assumes the compiler 114 has combined each of the unconditional sequences of operation formed by HDL synthesis block 504 (shown in FIG. 5) into one unconditional submodel 609. The unconditional submodel 609 executes in a statically determinable number of unconditional instruction steps. The number of instruction steps necessary to execute the unconditional submodel 609 determines the length of one emulation cycle.

At block 708, the unconditional submodel 609 is evaluated. At block 710, the submodel identifier of the unconditional submodel 609 is written into the submodel register 316 by the sequencer 302 for each synchronized group of processors 202 that evaluates the unconditional submodel 609.

At decision block 712, the submodel identifier is provided by the submodel register 316 to the submodel matching blocks 314. Only those instruction words that have a field that matches the submodel identifier of the unconditional submodel 609 will be processed. As discussed above, the submodel matching block 314 controls the ability of the processor 310 to write to the memory 312. If the instruction word does not contain a field with a submodel identifier that matches the submodel under evaluation, then the method 700 proceeds to block 716 and the processed output is not stored to the memory 312. If the instruction word does contain a field with a submodel identifier that matches the submodel under evaluation, then the method 700 proceeds to block 714 and the processed output is stored to the memory 312. Thus, only the unconditional submodel 609 will have effect upon the memory 312.

At decision block 717, a determination is made as to whether all of the instructions in the unconditional submodel 609 have been evaluated. If all of the instructions have been evaluated, then the method 700 proceeds to block 740 and the method 700 ends. If all of the instructions have not been evaluated, then the method proceeds to decision block 718.

At decision block 718, the emulation system 100 must determine if it will execute a conditional submodel 607 or continue to execute the unconditional submodel 609. At the end of an emulation cycle, i.e., the number of steps necessary to evaluate the unconditional submodel 609, the emulation system 100 determines if the conditional submodel 607 should execute. The determination is made by checking if a condition for the submodel activation signal 608 is true. If the condition is true, then the method 700 proceeds to block 720 and begins execution of the conditional submodel 607. If the condition is false, then the method 700 loops back to block 708 and executes the unconditional submodel 609.

At block 720, the conditional submodel 607 is executed. At block 722, the submodel identifier of the conditional submodel 607 is written into the submodel register 316 of each synchronized group of processors 202 that evaluates the conditional submodel 607.

At decision block 724, the submodel identifier is provided by the submodel register 316 to the submodel matching blocks 314. Only those instruction words that have a field that matches the submodel identifier of the unconditional submodel 609 will be processed. The submodel matching block 314 controls the ability of the processor 310 to write to the memory 312. If the instruction word does not contain a field with a submodel identifier that matches the submodel under evaluation, then the method 700 proceeds to block 726 and the processed output is not stored to the memory 312. If the instruction word does contain a field with a submodel identifier that matches the submodel under evaluation, then the method 700 proceeds to block 728 and the processed output is stored to the memory 312. Thus, only the conditional submodel 607 will have effect upon the memory 312.

At decision block 730, the emulation system 100 determines if the conditional submodel 607 has been completely evaluated. The conditional submodel has an extended emulation cycle, i.e., it takes a greater number of emulation steps to evaluate the conditional submodel 607 than the unconditional submodel. If the decision is no, then the method 700 loops to step 712 and the conditional submodel 607 is still evaluated. If the decision is yes, then the method proceeds to block 732 and a completion signal 612 is generated. At block 734, the completion signal 612 causes a synchronized jump instruction, described above, to be executed by the synchronized group of processors 202.

At block 736, the synchronized processor group 202 that executes the synchronized jump instruction enters into a "wait" state. At decision block 738, the synchronized processor group 202 determines if all of the other synchronized processor groups 202 are available to begin execution of the unconditional submodel 609. If the decision is no, then the method 700 loops back to decision block 738. If the answer is yes, then the method 700 loops back to block 708. At block 708, the synchronizer 201 signals the synchronized processor groups 202 to execute the unconditional submodel 609.

Thus, the present invention provides a method and apparatus to efficiently evaluate an unconditional submodel and one or more conditional submodels. The apparatus ensures that only the submodel under evaluation is processed and the output written to memory by utilizing a selectable-write memory. The compiler separates sequences of instructions into unconditional and conditional submodels and assigns these submodels to synchronized groups of processors. The evaluation of the submodels is very efficient because the synchronized group of processors only evaluates one particular submodel at a time.

While the foregoing is directed to embodiments of the present invention, other and further embodiments of the invention may be devised without departing from the basic scope thereof, and the scope thereof is determined by the claims that follow.

What is claimed is:

1. An apparatus for performing hardware emulation using synchronized processors comprising:
    a plurality of processors, the plurality of processors part of an emulation chip, defining a plurality of processor groups for evaluating data regarding a hardware design that has been divided into an unconditional submodel and a conditional submodel;
    a data memory coupled to the plurality of processors;
    a plurality of submodel matching blocks coupled to the data memory and configured to control whether a processor of the plurality of processors can write to the data memory based on whether the processor is evaluating a submodel currently selected for evaluation;
    a synchronizer for synchronizing the operation of the plurality of processor groups while emulating at least a portion of the hardware design such that the plurality of processor groups first select the unconditional submodel for evaluation, then select the conditional submodel for evaluation after instructions of the unconditional submodel have been evaluated, wherein each of the plurality of processor groups enters a wait state until the unconditional submodel has been completely evaluated.

2. The apparatus of claim 1 further comprising an instruction point register coupled to a plurality of instruction memories and where each instruction memory in the plurality of instruction memories is coupled to a processor in the plurality of processors.

3. The apparatus of claim 1 where each submodel matching block in the plurality of submodel matching blocks is coupled to an instruction memory in the plurality of instruction memories.

4. The apparatus of claim 3 where each submodel matching block in the plurality of submodel matching blocks is coupled to a submodel register.

5. The apparatus of claim 1 further comprising:
    a synchronizer for each of the plurality of processor groups.

6. The apparatus of claim 5 wherein each processor group evaluates a different submodel while the conditional submodel is evaluated.

7. A method for performing hardware emulation using synchronized processors comprising:
    providing a synchronization signal to a plurality of processors defining a plurality of processor groups for evaluating data regarding a hardware design that has been divided into an unconditional submodel and a conditional submodel, the plurality of processors part of an emulation chip;
    receiving a ready signal from each of the plurality of processor groups;
    providing an execution signal to each of the plurality of processor groups, where the execution signal causes each processor group to first evaluate the unconditional submodel and then evaluate the conditional submodel after instructions of the unconditional submodel have been evaluated;
    supplying a wait instruction to at least one processor group of the plurality of processor groups while the conditional submodel is being evaluated, where the wait instruction invokes a wait state; and
    controlling whether a processor of the plurality of processors can write to a memory based on whether the processor is evaluating a submodel currently selected for evaluation.

8. The method of claim 7 further comprising:
    upon completing evaluation of the conditional submodel, releasing each processor group that received a wait instruction from the wait state.

9. The method of claim 7 wherein the synchronization signal is provided to an instruction point register within the processor group.

10. The method of claim 9 further comprising placing each processor group into a wait state.

11. The method of claim 10 wherein the ready signal is provided to the synchronization block from a processor within each processor group in the plurality of processor groups.

12. The method of claim 11 wherein the step of controlling further comprises:
    providing a submodel identifier from a submodel register to a submodel matching block;
    comparing the submodel identifier to a field in an instruction word; and producing a selectable write signal based upon the comparison between the submodel identifier and the field in the instruction word.

13. The method of claim 12 further comprising:
providing the selectable write signal to the memory;
evaluating the submodel with a processor to produce an output; and
providing the output to the memory.

14. The method of claim 13 wherein the selectable write signal is a write-enable signal and the output is stored to the memory.

15. The method of claim 13 wherein the selectable write signal is a write-disable signal and the output is not stored to the memory and the memory remains unchanged.

* * * * *